United States Patent
Cho et al.

(10) Patent No.: US 7,696,626 B2
(45) Date of Patent: Apr. 13, 2010

(54) SEMICONDUCTOR DEVICE AND METHOD OF ARRANGING PAD THEREOF

(75) Inventors: Young-Ok Cho, Seongnam-si (KR); Jun-Bae Kim, Seoul (KR); Chan-Hee Jeon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 258 days.

(21) Appl. No.: 11/304,226

(22) Filed: Dec. 15, 2005

(65) Prior Publication Data

US 2006/0131739 A1    Jun. 22, 2006

(30) Foreign Application Priority Data

Dec. 16, 2004    (KR) ............... 10-2004-0107441

(51) Int. Cl.
*H01L 23/48* (2006.01)
*H01L 23/52* (2006.01)

(52) U.S. Cl. .......... 257/758; 257/773; 257/786; 257/774; 257/E23.145

(58) Field of Classification Search ........ 257/758, 257/774, 773, 786, E23.145
See application file for complete search history.

(56) References Cited

U.S. PATENT DOCUMENTS

| | | | |
|---|---|---|---|
| 5,365,112 A * | 11/1994 | Ohshima ............... 257/784 |
| 5,962,919 A * | 10/1999 | Liang et al. ............ 257/748 |
| 6,037,668 A | 3/2000 | Cave et al. |
| 6,287,950 B1 | 9/2001 | Wu et al. |
| 6,309,956 B1 | 10/2001 | Chiang et al. |
| 6,365,970 B1 | 4/2002 | Tsai et al. |
| 6,433,438 B2 | 8/2002 | Koubuchi et al. |
| 6,452,274 B1 * | 9/2002 | Hasegawa et al. ...... 257/758 |
| 6,459,154 B2 | 10/2002 | Kim |
| 6,524,942 B2 | 2/2003 | Tsai et al. |
| 6,570,100 B1 | 5/2003 | Bo |
| 6,576,970 B2 | 6/2003 | Kim |
| 6,664,642 B2 | 12/2003 | Koubuchi et al. |
| 6,734,572 B2 | 5/2004 | Nin |
| 6,812,578 B2 | 11/2004 | Kim et al. |
| 6,844,254 B2 | 1/2005 | Maruoka |
| 6,844,626 B2 | 1/2005 | Lai et al. |
| 6,853,081 B2 * | 2/2005 | Nakamura et al. ........ 257/758 |
| 6,951,773 B2 | 10/2005 | Ho et al. |

(Continued)

FOREIGN PATENT DOCUMENTS

JP    05-347412    12/1993

(Continued)

*Primary Examiner*—Nitin Parekh
(74) *Attorney, Agent, or Firm*—Mills & Onello, LLP

(57) ABSTRACT

A semiconductor device and method of forming a pad thereof are provided. The device includes: a substrate; at least one first active region disposed in a first region of the substrate; at least one second active region disposed in a second region adjacent to the first region of the substrate; a plurality of first contacts disposed on the second active region; a first insulating layer disposed on the first active region and between the first contacts; a poly layer disposed on the first contacts and the first insulating layer; a plurality of second contacts disposed on the poly layer in the second region; a second insulating layer disposed between the second contacts and on the poly layer in the first region; and a pad disposed on the second insulating layer and the second contacts.

20 Claims, 3 Drawing Sheets

U.S. PATENT DOCUMENTS

| | | |
|---|---|---|
| 7,015,129 B2 | 3/2006 | Lai et al. |
| 7,045,903 B2 * | 5/2006 | Efland et al. ................. 257/784 |
| 2002/0058411 A1 | 5/2002 | Hasegawa et al. |
| 2002/0094670 A1 | 7/2002 | Maruoka |
| 2002/0113313 A1 | 8/2002 | Kim et al. |
| 2002/0195712 A1 | 12/2002 | Nohsoh et al. |
| 2004/0090756 A1 | 5/2004 | Ho et al. |
| 2004/0227178 A1 * | 11/2004 | Ding ........................... 257/315 |
| 2004/0235223 A1 | 11/2004 | Lai et al. |
| 2005/0048759 A1 | 3/2005 | Hsu |
| 2005/0095836 A1 | 5/2005 | Lai et al. |
| 2005/0230797 A1 | 10/2005 | Ho et al. |

FOREIGN PATENT DOCUMENTS

| | | |
|---|---|---|
| JP | 11-135799 | 5/1999 |
| KR | 10-2002-0065331 | 8/2002 |
| KR | 10-2003-0025796 | 3/2003 |
| TW | 437030 | 5/2001 |
| TW | 464057 | 11/2001 |
| TW | 507346 | 10/2002 |
| TW | 536780 | 6/2003 |
| TW | 537495 | 6/2003 |
| TW | 548755 | 8/2003 |
| TW | 579589 | 3/2004 |
| TW | I221330 | 9/2004 |
| TW | I221664 | 10/2004 |
| TW | I222710 | 10/2004 |

* cited by examiner

SEMICONDUCTOR DEVICE AND METHOD OF ARRANGING PAD THEREOF

CROSS-REFERENCE TO RELATED APPLICATION

This application claims the benefit of Korean Patent Application No. 2004-107441, filed Dec. 16, 2004, the contents of which are hereby incorporated herein by reference in their entirety.

BACKGROUND OF THE INVENTION

1. Field of the Invention

The present invention relates to a semiconductor device and, more particularly, to a semiconductor device and method of arranging a pad thereof that increases heat emission efficiency.

2. Description of Related Art

In a conventional semiconductor memory device, a pad includes an upper pad and a lower pad, and dummy layers are disposed under the pad in order to adjust the step height relative to adjacent portions and alleviate stress applied during a wire bonding process for connecting the pad to pins. However, in the conventional semiconductor memory device, insulating layers are interposed between the dummy layers. Thus, heat is not properly dissipated from the semiconductor memory device because the insulating layers have low thermal conductivity. As a result, the semiconductor memory device becomes less efficient in dissipating heat, and its operating performance becomes poorer.

For this reason, many attempts are being made to improve the heat-dissipation efficiency of the semiconductor memory device. Furthermore, high-speed semiconductor memory devices need to improve the heat-dissipation efficiency all the more because as the semiconductor memory devices operate faster, more heat is generated.

FIG. 1A is a plan view of a pad of a conventional semiconductor memory device, and FIG. 1B is a cross-sectional view taken along line X-X' of FIG. 1A. Referring to FIGS. 1A and 1B, an active region 12 is disposed in a substrate 10, a first insulating layer 14 is disposed on the active region 12, and a gate poly layer 16 is disposed on the first insulating layer 14. A second insulating layer 18 is disposed on the gate poly layer 16, a plate poly layer 20 is disposed on the second insulating layer 18, and a third insulating layer 22 is disposed on the plate poly layer 20. A first metal layer 24 is disposed on the third insulating layer 22, a via contact 26 is disposed on the first metal layer 24, and a second metal layer 28 is disposed on the via contact 26.

In FIGS. 1A and 1B, the first metal layer 24 forms a lower pad, and the second metal layer 28 forms an upper pad, and the lower and upper pads are connected by the via contact 26 interposed between the first and second metal layers 24 and 28. Also, the third insulating layer 22, the plate poly layer 20, the second insulating layer 18, the gate poly layer 16, and the first insulating layer 14, which are formed under the first metal layer 24, are dummy layers that serve to adjust the step height with adjacent regions in the semiconductor device and alleviate stress applied during a wire bonding process for connecting the upper pad to pins (not shown).

In the pad of the conventional semiconductor device, when heat is generated in the substrate 10, it propagates through the active region 12 to the first insulating layer 14, the gate poly layer 16, the second insulating layer 18, the plate poly layer 20, and the third insulating layer 22, and the heat propagated to the third insulating layer 22 is transmitted through the first metal layer 24, the via contact 26, and the second metal layer 28 and dissipated from the semiconductor device.

However, the conventional semiconductor memory device cannot effectively dissipate the heat generated therein because the first, second, and third insulating layers used as dummy layers have low thermal conductivity.

SUMMARY OF THE INVENTION

The invention provides a semiconductor device that can effectively dissipate heat generated therein through a pad.

The invention also provides a method of arranging a pad of the semiconductor device.

In one aspect, the invention is directed to a semiconductor device including: a substrate; at least one active region disposed in the substrate; a plurality of first contacts disposed on the active region and insulated from each other; a poly layer disposed on the first contacts; a plurality of second contacts disposed on the poly layer and insulated from each other; and a pad disposed on the second contacts.

The first contacts and the poly layer can be repetitively disposed. The poly layer can be a gate poly layer, a plate poly layer, or a bit line poly layer. The first contacts can be direct contacts. The first contacts can be disposed in a matrix.

The second contacts can be metal contacts, and they can be arranged in a matrix form.

The pad can include: a first metal layer disposed on the second contacts; a third contact disposed on the first metal layer; and a second metal layer disposed on the third contact. The third contact may be a via contact, that electrically connects between the first metal and the second metal. The pad can be a power supply pad used to supply power.

In another aspect, the invention is directed to a semiconductor device including a substrate; at least one first active region disposed in a first region of the substrate; at least one second active region disposed in a second region adjacent to the first region of the substrate; a plurality of first contacts disposed on the second active region; a first insulating layer disposed on the first active region and between the first contacts; a poly layer disposed on the first contacts and the first insulating layer; a plurality of second contacts disposed on the poly layer in the second region; a second insulating layer disposed between the second contacts and on the poly layer in the first region; and a pad disposed on the second insulating layer and the second contacts.

The first contacts, the first insulating layer, and the poly layer can be repetitively disposed. The poly layer can be a gate poly layer, a plate poly layer, or a bit line poly layer.

The first contacts can be direct contacts and can be arranged in a matrix.

The second contacts can be metal contacts and can be arranged in a matrix.

The pad can include: a first metal layer disposed on the second insulating layer and the second contacts; a third contact disposed on the first metal layer; and a second metal layer disposed on the third contact. The third contact can be a via contact that electrically connects the first metal layer and the second metal layer.

The third contact can be a via contact that electrically connects the first metal layer and the second metal layer. The pad can be a power supply pad used to supply power.

According to another aspect, the invention is directed to a method of forming a pad of a semiconductor device including forming at least one active region in a substrate. A plurality of separate first contacts are formed on the active region, and a poly layer is formed on the first contacts. A plurality of separate second contacts are formed on the poly layer, and the pad is formed on the second contacts.

The first contacts and the poly layer can be repetitively formed. The poly layer can be a gate poly layer, a plate poly layer or a bit line poly layer.

Forming the pad can include: forming a first metal layer on the second contacts; forming a third contact on the first metal layer; and forming a second metal layer on the third contact.

The pad can be a power supply pad used to supply power.

According to another aspect, the invention is directed to a method of forming a pad of a semiconductor device including forming at least one first active region in a first region of a substrate. At least one second active region is formed in a second region of the substrate adjacent to the first region. A plurality of first contacts are formed on the second active region, and a first insulating layer is formed on the first active region between the first contacts. A poly layer is formed on the first contacts and the first insulating layer. A plurality of second contacts are formed on the poly layer in the second region, and a second insulating layer is formed between the second contacts and on the poly layer in the first region. The pad is formed on the second insulating layer and the second contacts.

The first contacts, the first insulating layer and the poly layer can be repetitively formed. The poly layer can be a gate poly layer, a plate poly layer or a bit line poly layer.

Forming the pad can include: forming a first metal layer on the second insulating layer and the second contacts; forming a third contact on the first metal layer; and forming a second metal layer on the third contact.

The pad can be a power supply pad used to supply power.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

A semiconductor device and method of arranging a pad thereof according to the present invention will now be described more fully hereinafter with reference to the accompanying drawings, in which exemplary embodiments of the invention are shown. It should be noted that, throughout the description, unless noted otherwise, when a layer is described as being formed on another layer or on a substrate, the layer may be formed directly on the other layer or on the substrate, or one or more layers may be interposed between the layer and the other layer or the substrate.

Figure 1A:
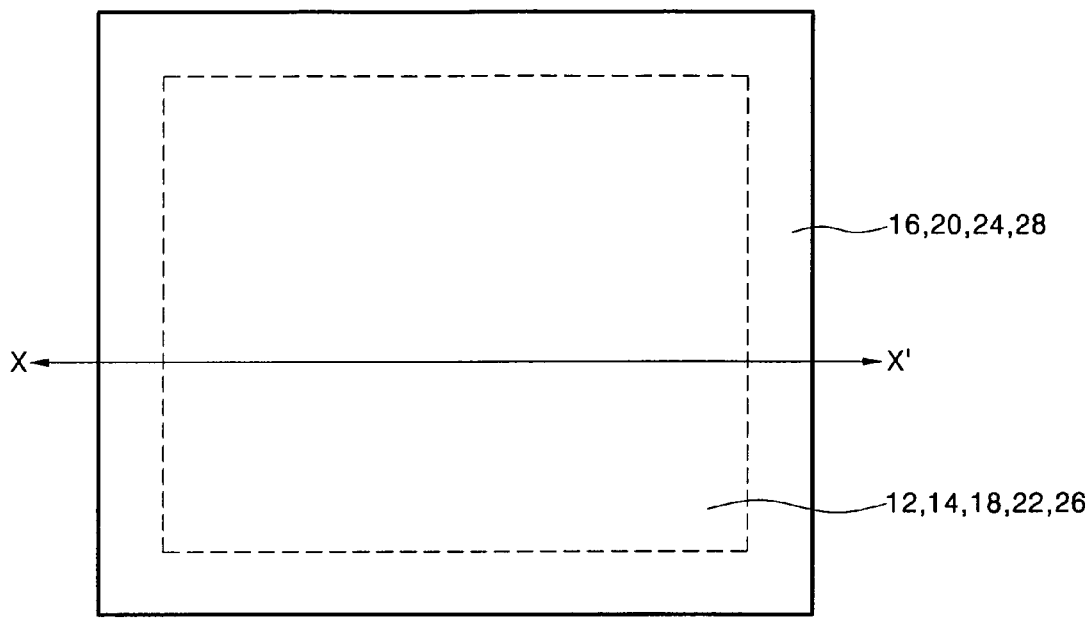
FIGS. 1A and 1B are a plan view and a cross-sectional view of a pad of a conventional semiconductor device, respectively.
Figure 1B:
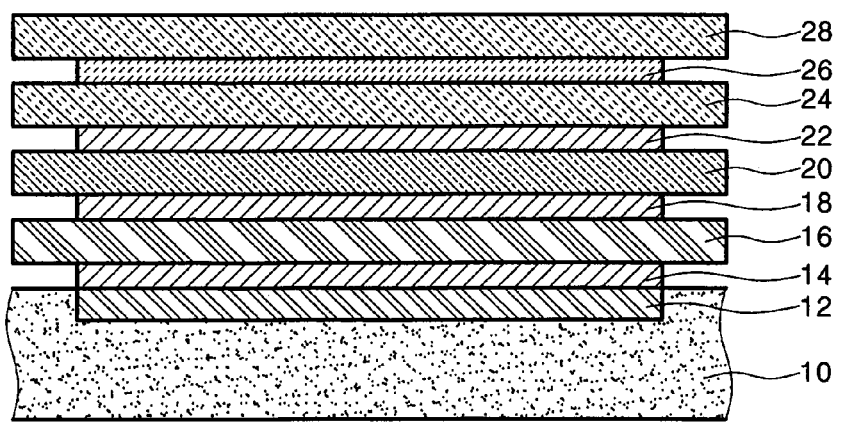
Figure 2A:
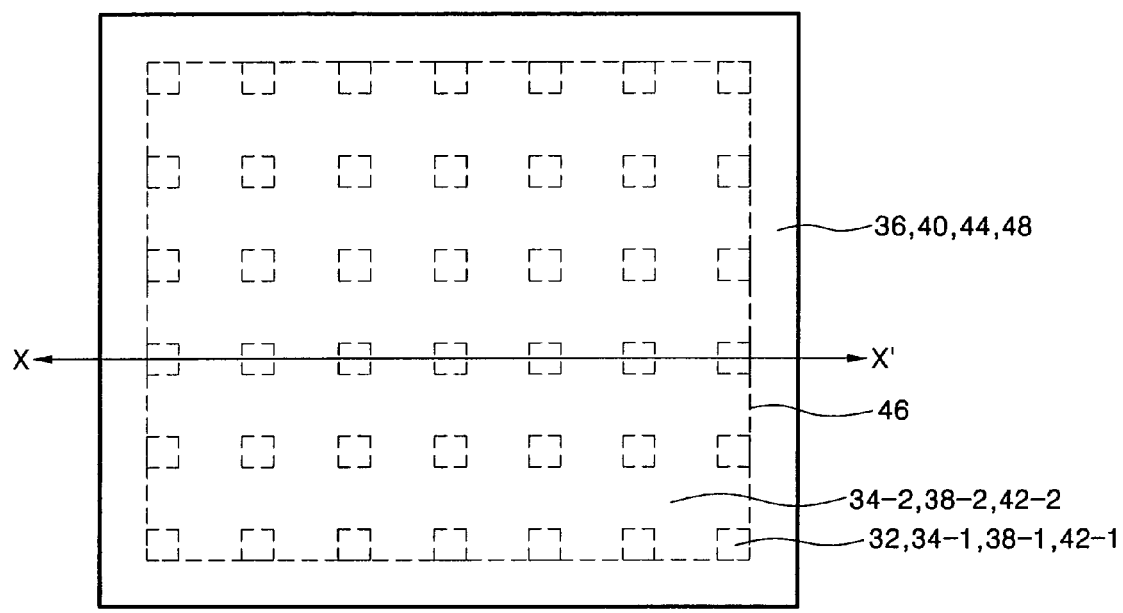
FIGS. 2A and 2B are a plan view and a cross-sectional view of a pad of a semiconductor device according to an exemplary embodiment of the present invention, respectively.
Figure 2B:
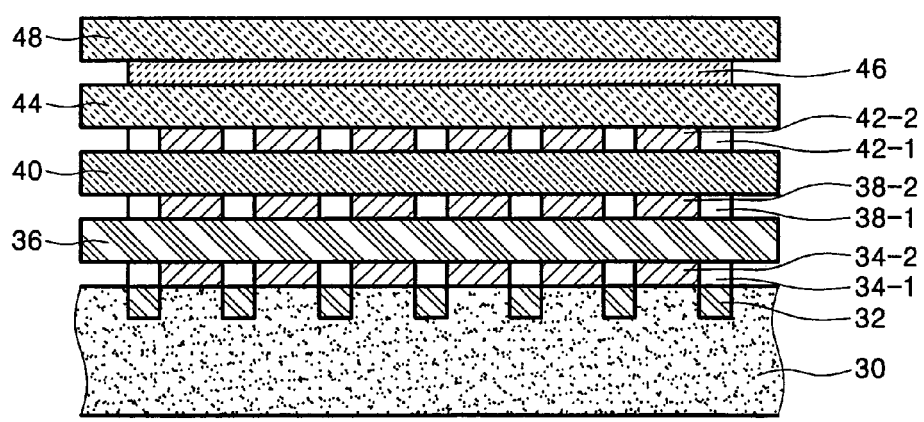

FIG. 2A is a plan view of a pad of a semiconductor device according to an exemplary embodiment of the present invention, and FIG. 2B is a cross-sectional view taken along line X-X' of FIG. 2A.

A method of arranging the pad shown in FIGS. 2A and 2B will now be described.

A plurality of active regions 32 are separately disposed in a substrate 30, a plurality of first direct contacts 34-1 are separately disposed on respective active regions 32, and a first insulating layer 34-2 is disposed on regions between the first direct contacts 34-1 in order to insulate the first direct contacts 34-1 from each other. A gate poly layer 36 is disposed on the first direct contacts 34-1 and the first insulating layer 34-2, a plurality of second direct contacts 38-1 are separately disposed on the gate poly layer 36 in the same positions as the respective active regions 32, and a second insulating layer 38-2 is disposed on regions between the second direct contacts 38-1 in order to insulate the second direct contacts 38-1 from each other. A bit line poly layer 40 is disposed on the second direct contacts 38-1 and the second insulating layer 38-2, a plurality of metal contacts 42-1 are separately disposed in the same positions as the respective direct contacts 38-1, and a third insulating layer 42-2 is disposed on regions between the metal contacts 42-1 in order to insulate the metal contacts 42-1 from each other. A first metal layer 44 is disposed on the metal contacts 42-1 and the third insulating layer 42-2, a via contact 46 is disposed on the first metal layer 44, and a second metal layer 48 is disposed on the via contact 46. As can be seen from FIG. 2A, the first direct contacts 34-1, the second direct contacts 38-1, and the metal contacts 42-1 are separately arranged in a matrix shape.

In FIGS. 2A and 2B, the bit line poly layer 40 may be replaced by a plate poly layer, and the active regions 32 may be not separately disposed but integrally disposed.

In the pad of the semiconductor device of the present embodiment, like the pad of the conventional semiconductor device, the first and second metal layers 44 and 48 form a lower pad and an upper pad, respectively. And in this embodiment, the second metal layer 48 is electrically connected to the metal contacts 42-1, the bit line poly layer 40, the second direct contacts 38-1, the gate poly layer 36, the first dielectric contacts 34-1, and the active regions 32. The second direct contacts 38-1 have conductivity. Accordingly, when a voltage is applied to the pad, it is applied from the second metal layer 48 to the active regions 32.

In the pad of the above-described semiconductor device, the first, second, and third insulating layers 34-2, 38-2, and 42-2 are formed in the same positions as the first, second, and third insulating layers disposed under the pad of the conventional semiconductor device, and a plurality of contacts 34-1, 38-1, 42-1, and 46 are also disposed among the first, second, and third insulating layers 34-2, 38-2, and 42-2. Thus, heat generated in the substrate 30 of the semiconductor device can be effectively dissipated through the contacts 34-1, 38-1, 42-1, and 46.

That is, in comparison to the conventional semiconductor device in which insulating layers having low thermal conductivity are disposed on a large region under the pad so that heat cannot be effectively dissipated from the semiconductor device, according to the present invention, a plurality of contacts having high thermal conductivity are disposed to facilitate dissipation of heat from the semiconductor device.

Figure 3A:
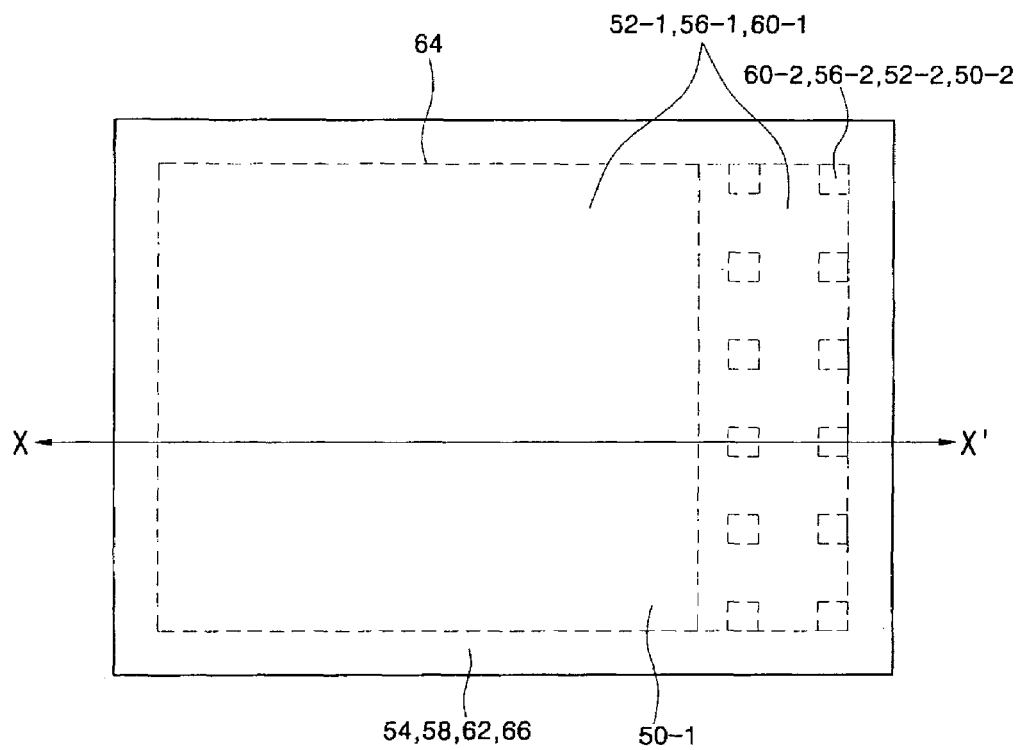
FIGS. 3A and 3B are a plan view and a cross-sectional view of a pad of a semiconductor device according to another exemplary embodiment of the present invention, respectively.
Figure 3B:
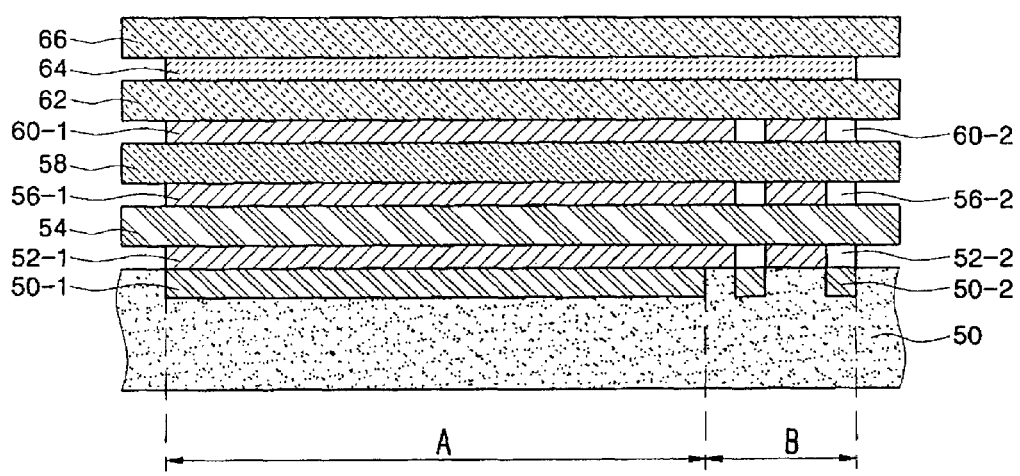

FIG. 3A is a plan view of a pad of a semiconductor device according to another exemplary embodiment of the present invention, and FIG. 3B is a cross-sectional view taken along line X-X' of FIG. 3A.

A method of arranging the pad shown in FIGS. 3A and 3B will now be described.

Active regions 50-1 and 50-2 are separately disposed in a substrate 50. In this case, the active region 50-1 is formed wider than the active regions 50-2. A first insulating layer 52-1 and first direct contacts 52-2 are separately disposed on the respective active regions 50-1 and 50-2, and the first insulating layer 52-1 is disposed on regions between the first direct contacts 52-2 in order to insulate the first direct contacts 52-2 from each other. A gate poly layer 54 is integrally disposed on the first insulating layer 52-1 and the first direct contacts 52-2. Second direct contacts 56-2 are disposed on the gate poly layer 54 in the same positions as the first direct contacts 52-2, respectively, and a second insulating layer 56-1 is disposed on regions where the second direct contacts 56-2 are not disposed. A bit line poly layer 58 is integrally disposed on the second insulating layer 56-1 and the second direct contacts 56-2, metal contacts 60-2 are disposed on the bit line poly layer 58 in the same positions as the second direct contacts 52-2, respectively, and a third insulating layer 60-1 is disposed on regions where the metal contacts 60-2 are not disposed. A first metal layer 62 is integrally disposed on the third insulating layer 60-1 and the metal contacts 60-2, a via contact 64 is disposed on the first metal layer 62, and a second metal layer 66 is disposed on the via contact 64.

In FIGS. 3A and 3B, the bit line poly layer 58 may be replaced by a plate poly layer, and the active regions 50-1 and 50-2 may be not separately disposed but integrally disposed.

In the pad of the semiconductor device of the present embodiment, components in a region A are arranged in the same manner as the conventional pad, and components in a region B are arranged in the same manner as described with reference to FIGS. 2A and 2B.

That is, in the pad of the above-described semiconductor device, the first metal layer 62 and the second metal layer 66 form a lower pad and an upper pad, respectively, and a structure that is disposed under the second metal layer 66 is arranged to reduce the step height with adjacent circuits and alleviate stress applied during a wire bonding process. Also, a structure that is disposed under region B of the second metal layer 66 is the same as the structure shown in FIGS. 2A and 2B. Thus, heat generated in the substrate 50 of the semiconductor device can be effectively dissipated through the first and second direct contacts 52-2 and 56-2 and the metal contacts 60-2.

In the semiconductor device shown in FIGS. 3A and 3B, the structure disposed in the region B is arranged in a region between pads where a circuit is not disposed, so that it is possible to arrange the pads without increasing a layout area.

Also, the pad structure according to the present invention can be applied to all pads of the semiconductor device or only some pads that dissipate a lot of heat, for example, only pads used to supply a power supply voltage or a ground voltage.

In the above exemplary embodiments, the pad is described as including two metal layers and two poly layers disposed under the metal layers, but the pad may include three metal layers and one or three poly layers disposed under the metal layers.

According to the present invention as described above, heat generated in the semiconductor device can be effectively dissipated through the contacts disposed under the pad.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
 a substrate;
 a plurality of active regions separately disposed in the substrate;
 a plurality of first contacts separately disposed on respective ones of the plurality of active regions;
 a first insulating layer disposed on the plurality of active regions and insulating between the plurality of the first contacts;
 a poly layer overall disposed on the first contacts and the first insulating layer;
 a plurality of second contacts disposed on the poly layer;
 a second insulating layer disposed on the poly layer and insulating between the plurality of the second contacts; and
 a pad including at least one metal layer overall disposed on the second contacts and the second insulating layer,
 wherein the plurality of the first contacts electrically connect the plurality of active regions and the poly layer and the plurality of the second contacts electrically connect the poly layer and the pad.

2. The device according to claim 1, wherein the first contacts and the poly layer are repetitively disposed.

3. The device according to claim 2, wherein the poly layer is a layer selected from the group consisting of a gate poly layer, a plate poly layer, and a bit line poly layer.

4. The device according to claim 2, wherein the repetitively disposed first contacts and the ploy layer comprise;
 a first plurality of first contacts disposed on respective ones of the plurality of active regions and insulated from each other;
 the poly layer disposed on the first plurality of the first contacts;
 a second plurality of first contacts disposed on the poly layer and insulated from each other; and
 a second poly layer disposed on the second plurality of first contacts,
wherein the plurality of second contacts is disposed on the second poly layer and wherein the first plurality of the first contacts and the second plurality of the second contacts are arranged in substantially identical patterns.

5. The device according to claim 4, wherein the first plurality of the first contacts and the second plurality of the first contacts are arranged in a matrix.

6. The device according to claim 1, wherein the second contacts are metal contacts.

7. The device according to claim 6, wherein the second contacts are arranged in a matrix.

8. The device according to claim 1, wherein the pad includes:
 a first metal layer disposed on the second contacts;
 a third contact disposed on the first metal layer; and
 a second metal layer disposed on the third contact.

9. The device according to claim 8, wherein the third contact is a via contact that electrically connects the first metal layer and the second metal layer.

10. The device according to claim 1, wherein the pad is a power supply pad used to supply power.

11. The device according to claim 10, wherein the first contacts, the first insulating layer, and the poly layer are repetitively disposed.

12. The device according to claim 11, wherein the poly layer is a layer selected from the group consisting of a gate poly layer, a plate poly layer, and a bit line poly layer.

13. The device according to claim 11, wherein the repetitively disposed first contacts and the ploy layer comprise:

a first plurality of the first contacts disposed on respective ones of the second active regions and insulated from each other;

the poly layer disposed on the first plurality of first contacts;

a second plurality of the first contacts disposed on the poly layer and insulated from each other; and a second poly layer disposed on the second plurality of the first contacts, wherein the plurality of the second contacts is disposed on the second poly layer and wherein the first plurality of the first contacts and the second plurality of the first contacts are arranged in substantially identical patterns.

14. The device according to claim 13, wherein the first plurality of the first contacts and the second plurality of the first contacts are arranged in a matrix.

15. A semiconductor device comprising:

a substrate;

at least one first active region disposed in a first region of the substrate;

a plurality of second active regions separately disposed in a second region adjacent to the first region of the substrate;

a plurality of first contacts separately disposed on respective ones of the second active regions;

a first insulating layer disposed on the first active region and between the first contacts;

a poly layer overall disposed on the first contacts and the first insulating layer;

a plurality of second contacts disposed on the poly layer in the second region;

a second insulating layer disposed between the second contacts and on the poly layer in the first region; and a pad including at least one metal layer overall disposed on the second insulating layer and the second contacts, wherein the plurality of the first contacts electrically connect the plurality of second active regions and the poly layer and the plurality of the second contacts electrically connect the poly layer and the pad.

16. The device according to claim 15, wherein the second contacts are metal contacts.

17. The device according to claim 16, wherein the second contacts are arranged in a matrix.

18. The device according to claim 15, wherein the pad includes:

a first metal layer disposed on the second contacts;

a third contact disposed on the first metal layer; and a second metal layer disposed on the third contact.

19. The device according to claim 18, wherein the third contact is a via contact that electrically connects the first metal layer and the second metal layer.

20. The device according to claim 15, wherein the pad is a power supply pad used to supply power.

* * * * *